(12) United States Patent
Suzuki

(10) Patent No.: US 9,142,725 B1
(45) Date of Patent: Sep. 22, 2015

(54) SEMICONDUCTOR LIGHT EMITTING ELEMENT

(71) Applicant: KABUSHIKI KAISHA TOSHIBA, Tokyo (JP)

(72) Inventor: Takeyuki Suzuki, Komatsu Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/475,498

(22) Filed: Sep. 2, 2014

(51) Int. Cl.
| | |
|---|---|
| *H01L 23/52* | (2006.01) |
| *H01L 33/00* | (2010.01) |
| *H01L 33/38* | (2010.01) |
| *H01L 33/32* | (2010.01) |
| *H01L 33/40* | (2010.01) |

(52) U.S. Cl.
CPC .............. *H01L 33/385* (2013.01); *H01L 33/32* (2013.01); *H01L 33/40* (2013.01)

(58) Field of Classification Search
CPC ........ H01L 33/385; H01L 33/32; H01L 22/40
USPC ........... 257/211, 95–99, 40, 758, 773, 72, 81, 257/100, E33.062, E33.05, E31.001, 257/E33.02; 438/128, 129, 26, 109, 48
See application file for complete search history.

(56) References Cited

U.S. PATENT DOCUMENTS

| | | | |
|---|---|---|---|
| 6,169,296 B1* | 1/2001 | Kamiyama et al. ............. | 257/94 |
| 7,420,218 B2 | 9/2008 | Nagai | |
| 7,569,854 B2* | 8/2009 | Yamazaki et al. ............... | 257/59 |
| 2009/0206325 A1* | 8/2009 | Biwa et al. ...................... | 257/28 |
| 2010/0117075 A1* | 5/2010 | Akimoto et al. ............... | 257/43 |
| 2011/0084268 A1* | 4/2011 | Yamazaki et al. ............... | 257/43 |
| 2011/0101399 A1* | 5/2011 | Suehiro et al. .................. | 257/98 |
| 2014/0061657 A1* | 3/2014 | Choi et al. ...................... | 257/72 |

FOREIGN PATENT DOCUMENTS

| | | |
|---|---|---|
| JP | 2007529879 A | 10/2007 |
| JP | 2011066297 A | 3/2011 |
| JP | 201330634 | 2/2013 |

* cited by examiner

*Primary Examiner* — Amar Movva
*Assistant Examiner* — Sheikh Maruf
(74) *Attorney, Agent, or Firm* — Patterson & Sheridan, LLP

(57) ABSTRACT

A light emitting element includes a first semiconductor layer of a first conductive type, a second semiconductor layer of a second conductive type, a light emitting layer. The light emitting layer is between the first semiconductor layer and the second semiconductor layer. A first electrode layer is on a first side of the second semiconductor layer. A second electrode layer is on the first side of the first semiconductor layer. Am insulation layer is between the first electrode layer and the second electrode layer. A first metal layer is between a substrate and the insulation layer and between the substrate and the second electrode layer. The second electrode layer includes a first portion contacting the first semiconductor layer and a second portion which spaced from the first semiconductor layer.

20 Claims, 7 Drawing Sheets

SEMICONDUCTOR LIGHT EMITTING ELEMENT

CROSS-REFERENCE TO RELATED APPLICATION

This application is based upon and claims the benefit of priority from Japanese Patent Application No. 2014-048049, filed Mar. 11, 2014, the entire contents of which are incorporated herein by reference.

FIELD

Embodiments described herein relate to a semiconductor light emitting element.

BACKGROUND

A semiconductor light emitting element such as a thin-film-type Light Emitting Diode (LED) in which a semiconductor layer including a light emitting layer is bonded to a substrate is known in the art. Such a semiconductor light emitting element is required to possess high reliability.

DETAILED DESCRIPTION

Figure 1A:
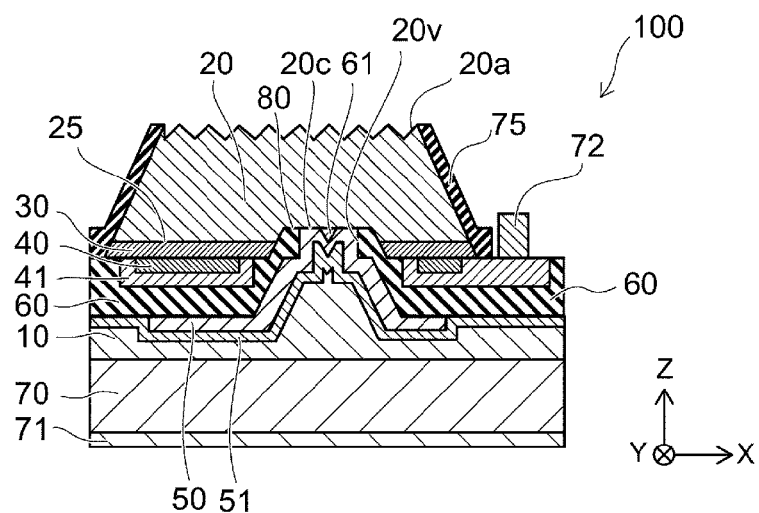
FIG. 1A is a schematic cross-sectional view illustrating a semiconductor light emitting element according to a first embodiment.

According to an embodiment, there is provided a semiconductor light emitting element having high reliability.

A light emitting element comprises a first semiconductor layer of a first conductive type with a first side and a second side opposite the first side and a second semiconductor layer of a second conductive type on the first side of the first semiconductor layer. A light emitting layer is between the first semiconductor layer and the second semiconductor layer. A first electrode layer is contacting the second semiconductor layer, which is between first electrode layer and the light emitting layer. A second electrode layer is contacting the first semiconductor layer on the first side along a first part of a surface of the first semiconductor layer. An insulation layer is between the first electrode layer and the second electrode layer, and is contacting a second part of the surface of the first semiconductor layer. The insulation layer is also between the second semiconductor layer and the second electrode layer. The second part of the surface is surrounding the first part of the surface. A first metal layer is between a substrate and the insulation layer and between the substrate and the second electrode layer. The second electrode layer includes a first portion contacting the first part of the surface of the first semiconductor layer and a second portion adjacent to first portion in a direction parallel to the surface. The second portion is spaced from the surface of the first semiconductor layer in a direction perpendicular to the surface. A thickness of the first metal layer between the substrate and the first portion of the second electrode layer is greater than a thickness of the first metal layer between the substrate and the second portion of the second electrode layer and the substrate.

In general, according to one embodiment, there is provided a semiconductor light emitting element or device including: a first semiconductor layer; a second semiconductor layer; a light emitting layer; a first electrode layer; a second electrode layer; an insulation layer; a substrate; and a first metal layer. The first semiconductor layer is of a first conductive type. The second semiconductor layer is of a second conductive type. The light emitting layer is formed between the first semiconductor layer and the second semiconductor layer. The first electrode layer is formed on a portion of the second semiconductor layer on a side opposite to a side where the light emitting layer is formed. The second electrode layer is formed on a portion of the first semiconductor layer on the same side as a side where the light emitting layer is formed. The insulation layer covers the first electrode layer, and is formed between the first electrode layer and the second electrode layer. The first metal layer is formed between the substrate and the insulation layer and between the substrate and the second electrode layer. The second electrode layer includes a first portion which is brought into contact with the first semiconductor layer, and a second portion which is formed away from the first semiconductor layer at an interval within a region surrounded by the insulation layer.

Hereinafter, respective embodiments are explained by reference to drawings. Here, these drawings illustrate the present exemplary embodiments schematically or conceptually and hence, in the drawings, the relationship between thicknesses and widths of respective parts, and a ratio between sizes of the respective parts and the like are not always equal to those of actual parts. Further, even when the same part is described in the plurality of drawings, there may be a case where the size and the ratio of the part in one drawing differs from the size and the ratio of the part in other drawings in accordance with the drawing.

In this disclosure and respective drawings, elements identical with the elements already explained in conjunction with the previous drawings are given the same symbols and their detailed explanation may be suitably omitted.

First Embodiment

Figure 1B:
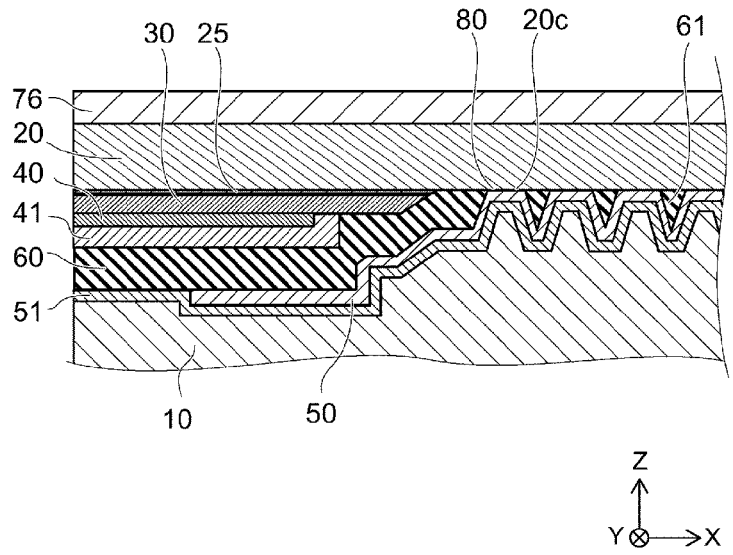
FIG. 1B is a schematic cross-sectional view illustrating a portion of the semiconductor light emitting element according to the first embodiment.

FIG. 1A and FIG. 1B are schematic cross-sectional views where a semiconductor light emitting element according to a first embodiment is exemplified.

As illustrated in FIG. 1A, a semiconductor light emitting element 100 according to the embodiment includes: an n-type semiconductor layer 20 (a first semiconductor layer of a first conductive type); a light irradiation surface 20a formed on the n-type semiconductor layer 20; a p-type semiconductor layer 30 (a second semiconductor layer of a second conductive type); a light emitting layer 25 formed between the n-type semiconductor layer 20 and the p-type semiconductor layer 30; a p-side electrode layer 40 (a first electrode layer) formed on a surface of the p-type semiconductor layer 30 on a side opposite to a side where the light emitting layer 25 is formed; a protective electrode 41 which is formed so as to cover the p-side electrode layer 40; an insulation layer 60 covering side surfaces of a groove 80 which is formed in the direction toward the n-type semiconductor layer 20 from a surface of the p-type semiconductor layer 30 where the p-side electrode layer 40 is formed, and formed so as to cover the protective electrode 41; an n-side electrode layer 50 (second electrode layer) formed so as to cover at least portions of the n-type semiconductor layer 20 which are exposed on a bottom surface of the groove 80; and a first metal layer 10 formed between the n-side electrode layer 50 and the insulation layer 60 and a support substrate 70 (a substrate) and connecting the n-side electrode layer 50 and the insulation layer 60 and the support substrate 70 to each other.

Further, in the embodiment, at least one or more spacers 61 are formed between the n-type semiconductor layer 20 exposed on the bottom surface of the groove 80 and the n-side electrode layer 50.

The first metal layer 10 includes a first metal. The first metal may contain or include one or more of tin (Sn), indium (In) and bismuth (Bi). The first metal layer 10 is comprises either an alloy of the first metal and a second metal or an intermetallic compound made of the first metal and the second metal, for example. The second metal may be, for example, at least one of nickel (Ni), cobalt (Co), copper (Cu), and gold (Au).

It is assumed in this description that the direction directed toward the light irradiation surface 20a from the first metal layer 10 is the Z-axis direction. It is assumed that one direction perpendicular to the Z-axis direction is the X-axis direction. It is assumed that one direction perpendicular to the X-axis direction and also perpendicular to the Z-axis direction is the Y-axis direction.

For example, the semiconductor light emitting element 100 is a light emitting diode (LED) which is formed using a GaN-based nitride semiconductor as a material. For example, the semiconductor light emitting element 100 has a thin-film structure. As described previously, for example, the semiconductor light emitting element 100 includes the n-type semiconductor layer 20 (for example, an n-type GaN layer), the light emitting layer 25 (semiconductor light emitting layer), and the p-type semiconductor layer 30 (for example, a p-type GaN layer). As the light emitting layer 25, a semiconductor layer formed of a nitride semiconductor or the like is used. The light emitting layer 25 has the multiple quantum well structure, for example.

The p-side electrode layer 40 is formed between the first metal layer 10 and the p-type semiconductor layer 30. The p-side electrode layer 40 is electrically connected to the p-type semiconductor layer 30. The p-side electrode layer 40 has at least one or more opening portions whose periphery is surrounded by the insulation layer 60, and the n-side electrode layer 50 is formed in the inside of the opening portion on the insulation layer 60. The p-side electrode layer 40 is formed on the p-type semiconductor layer 30, and is covered with the insulation layer 60 from an upper surface of the p-side electrode layer 40 to a side surface of the opening portion and hence, the p-side electrode layer 40 is insulated from the n-side electrode layer 50. The p-side electrode layer 40 is formed using silver (Ag), for example. Silver (Ag) exhibits a high optical reflectance, for example. The p-side electrode layer 40 reflects light emitted from the light emitting layer 25 toward the light irradiation surface 20a, for example.

The n-side electrode layer 50 is formed using aluminum (Al), for example. The n-side electrode layer 50 is electrically connected to the n-type semiconductor layer 20. For example, a thickness of the n-side electrode layer 50 (a length along the Z-axis direction) is from 200 nm to 400 nm (both inclusive). In the exemplary embodiment, the n-side electrode layer 50 is formed over an area ranging from the bottom surface of the groove 80 to the side surfaces of the groove 80, and is formed in an extending manner such that the n-side electrode layer 50 is interposed between the insulation layer 60 and the first metal layer 10 in the Z-axis direction.

The insulation layer 60 (interlayer insulation film) is formed between the first metal layer 10 and the p-side electrode layer 40 so as to insulate the first metal layer 10 and the p-side electrode layer 40 from each other, and is also formed between the n-side electrode layer 50 and the p-side electrode layer 40 so as to insulate the n-side electrode layer 50 and the p-side electrode layer 40 from each other. The insulation layer 60 is formed using silicon oxide ($SiO_2$) or silicon nitride (SiN), for example. A thickness (a length along the Z-axis direction) of the insulation layer 60 is from 500 nm to 1,500 nm inclusive, for example. Due to such a configuration, the insulation layer 60 may maintain the insulation property, for example.

In the semiconductor light emitting element 100, the insulation layer 60 formed on the side surface of the groove 80 has a via hole 20v, and the n-side electrode layer 50 (n contact metal) is formed in the via hole 20v. That is, a surface of the n-type semiconductor layer 20 exposed from a bottom surface of the via hole 20v configures a contact portion 20c between the n-type semiconductor layer 20 and the n-side electrode layer 50.

In the semiconductor light emitting element 100 according to the embodiment, the n-side electrode layer 50 is not formed on a surface of a chip, for example, on the light irradiation surface 20a, and the n-side electrode layer 50 is formed in the inside of the chip using the via hole 20v. Due to such a configuration, the external light extraction efficiency of an LED may be enhanced. In FIG. 1A, which is a cross-sectional view, the number of via holes 20v is one, and the number of n-side electrode layers 50 formed in the via hole 20v is one. However, the number of via holes 20v and the number of n-side electrode layers 50 are not limited to such a case. For example, the plurality of via holes 20v may be formed, and a plurality of n-side electrode layers 50 may be formed corresponding to the number of via holes 20v. Further, the bottom surfaces of the plurality of via holes 20v may be covered by a single n-side electrode layer 50 rather than a plurality of n-side electrode layers 50.

In this first embodiment, the protective electrode 41 is further formed between the p-side electrode layer 40 and the insulation layer 60. The protective electrode 41 has the laminated structure of Pt/Ti/Au layers or the like, for example. A thickness of the protective electrode 41 (a length along the Z-axis direction) is from 400 nm to 700 nm (both inclusive), for example. A pad electrode 72 is electrically connected to the p-side electrode layer 40 via the protective electrode 41.

The support substrate 70 is formed between aback surface electrode 71 and the first metal layer 10. The support substrate 70 is formed using silicon (Si), for example.

The second metal layer 51 is formed between the insulation layer 60 and the first metal layer 10 as well as between the n-side electrode layer 50 and the first metal layer 10. The second metal layer 51 has the laminated structure of Ti/Pt layers or the like, for example. The second metal layer 51 is barrier metal, for example. A thickness (a length along the Z-axis direction, for example) of the second metal layer 51 is from 200 nm to 400 nm (both inclusive).

FIG. 1B is a schematic cross-sectional view illustrating a portion of the semiconductor light emitting element 100 illustrated in FIG. 1A in an enlarged manner. In FIG. 1B, a plurality of spacers 61 are formed. The n-type semiconductor layer 20 is brought into contact with the first metal layer 10 at the contact portion 20c. At the contact portions 20c, the plurality of spacers 61 are formed between the first metal layer 10 and the n-type semiconductor layer 20. In the embodiment, the spacer 61 is formed of an insulation layer.

The spacer 61 may be formed using silicon oxide or silicon nitride, for example. As described later, the spacers 61 may be formed simultaneously with the insulation layer 60. Accordingly, a thickness of the spacer 61 in the Z-axis direction is substantially equal to a thickness of the insulation layer 60. Alternatively, the spacers 61 may be conductive. For example, the spacers 61 may be formed using the same material as that for forming the p-side electrode layer 40.

In this manner, in the semiconductor light emitting element 100 according to the embodiment, one or more spacers 61 are formed between the n-side electrode layer 50 and the n-type semiconductor layer 20, that is, at the contact portion 20c. The spacers 61 are formed on the surface of the n-type semiconductor layer 20 on a side opposite to the light irradiation surface 20a, and project toward the first metal layer 10. Further, the n-side electrode layer 50 is formed so as to cover the spacers 61. Accordingly, the n-side electrode layer 50 has a first portion which is brought into contact with the n-type semiconductor layer 20, and a second portion which covers the spacer 61 and is formed away from the n-type semiconductor layer 20 by an amount corresponding to a thickness of the spacer 61. By providing the second portion, it is possible to arrange a position of the second portion of the n-type electrode layer 50 which is formed on the bottom surface of the via hole 20v closer to a support substrate 70 side by an amount of a thickness of the spacer. Due to such a configuration, the difference between a distance between the second portion of the n-side electrode layer 50 which is formed on the contact portion 20c and the support substrate 70 and the shortest distance between the insulation layer 60 which is formed on the p-side electrode layer 40 and the substrate 70 may be decreased by an amount corresponding to a thickness of the spacer 61. Accordingly, in a bonding step described later, the occurrence of a bonding failure may be suppressed. Accordingly, the productivity, the reliability and the like of the semiconductor light emitting element may be enhanced.

FIG. 2A to FIG. 2F are schematic cross-sectional views exemplifying steps of manufacturing the semiconductor light emitting element according to the first embodiment.

Figure 2A:
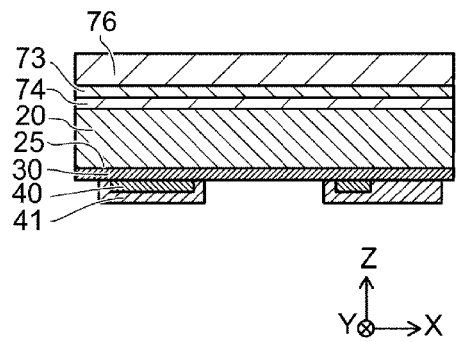
FIG. 2A to FIG. 2F are schematic cross-sectional views illustrating steps of manufacturing the semiconductor light emitting element according to the first embodiment.

As illustrated in FIG. 2A, a semiconductor layer is formed on a growth substrate 76. For example, a ground layer 73 (buffer layer), a GaN layer 74, the n-type semiconductor layer 20 (n-type GaN layer), the light emitting layer 25, and the p-type semiconductor layer 30 (p-type GaN layer) are laminated on the growth substrate 76 sequentially.

For example, a metal film which becomes the p-side electrode layer 40 is formed using a vacuum vapor deposition method or a sputtering method. Thereafter, the metal film which becomes the p-side electrode layer 40 is formed into a predetermined shape by patterning using a resist mask or the like. Thereafter, the protective electrode 41 is formed on the p-side electrode layer 40 using a lift-off method.

Figure 2B:
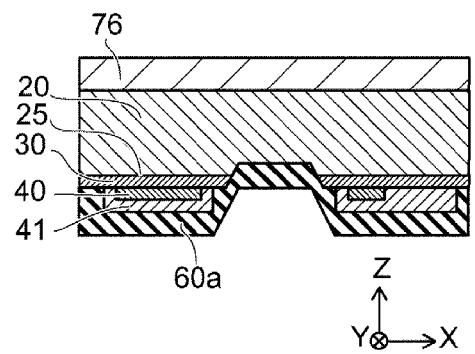

As illustrated in FIG. 2B, an opening portion is formed in the semiconductor layers (the p-type semiconductor layer 30, the light emitting layer 25, and the n-type semiconductor layer 20). For example, a resist is applied to the p-type semiconductor layer 30 and the protective electrode 41, and patterning is performed by photolithography or the like. Thereafter, a portion of the p-type semiconductor layer 30, a portion of the light emitting layer 25 and a portion of the n-type semiconductor layer 20 are etched by reactive ion etching (RIE). Due to such a treatment, a portion of the n-type semiconductor layer 20 is exposed.

Thereafter, an insulation film 60a which becomes the insulation layer 60 is formed using a plasma Chemical Vapor Deposition (CVD) method or a sputtering method. The insulation film 60a is formed on the p-type semiconductor layer 30, the protective electrode 41, and the exposed n-type semiconductor layer 20. It is desirable that the formation of the insulation film 60a be performed at a temperature of 300° C. or below, for example. By forming the insulation film 60a at such a temperature, it is possible to suppress the deterioration of reflectivity of the p-side electrode layer 40 and the deterioration of a contact resistance, for example.

For example, the insulation film 60a is formed by a plasma CVD method using silicon nitride. In this case, a mixed gas obtained by mixing $NH_3$ or $N_2$ in $SiH_4$ is used in the plasma CVD method.

For example, the insulation film 60a is formed by a plasma CVD method using silicon oxide. In this case, a mixed gas of $SiH_4$ and $N_2O$, a mixed gas of $SiH_4$ and $O_2$ or the like is used in the plasma CVD method.

When the insulation film 60a is formed by a sputtering method using SiN (silicon nitrides) or SiO (silicon oxides), for example, as a target while using argon plasma.

Figure 2C:
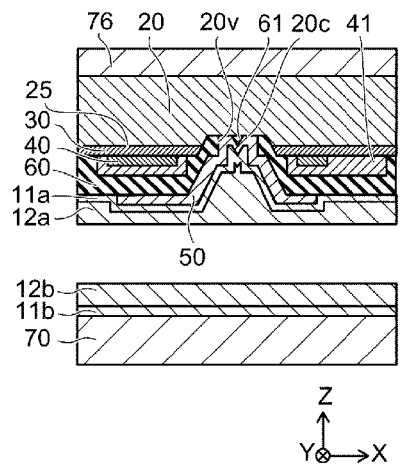

As illustrated in FIG. 2C, the insulation film 60a is formed by patterning. For example, the patterning is performed by an RIE method using a resist mask. Due to such patterning, the insulation layer 60 where the via hole 20v is formed is formed. A portion of the n-type semiconductor layer 20 is exposed on the bottom surface of the via hole 20v. A diameter of the via hole 20v (a length of the exposed n-type semiconductor layer 20 along the X-axis direction, for example) is from 30 µm to 100 µm (both inclusive), for example. Due to such a configuration, for example, it is possible to avoid the concentration of an electric current on the n contact (n-type electrode layer 50).

The spacers 61 (projections formed by an insulation film) may be formed in this step. That is, a portion of the insulation film 60a becomes the insulation layer 60, and other portions of the insulation film 60a become the spacers 61. At the time of forming the insulation layer 60 by patterning using an RIE method, the spacers 61 are also formed by patterning simultaneously with the insulation layer 60. Due to such a configuration, it is possible to suppress the occurrence of the case where the manufacturing step of forming the spacers 61 additionally increases.

Although the spacers 61 are formed using the portions of the insulation film 60a in the embodiment, the insulation layer 60 is formed by patterning and, thereafter, a metal layer is formed on the exposed n-type semiconductor layer 20 by patterning, for example. The spacers 61 may be formed in this manner. In this case, the spacers 61 also function as portions of the n-side electrode layer 50 and hence, a contact area is increased, whereby a contact resistance may be lowered.

Next, the n-side electrode layer 50 is formed such that the n-side electrode layer 50 covers the exposed n-type semiconductor layer 20 and the spacers 61 using a lift-off method, for example. Thereafter, the second metal layer 51 (first barrier metal layer 51a), a third metal layer 11a (first base-material metal formed by liquid phase diffusion bonding), a fourth metal layer 12a (first insert metal) are laminated on the n-side electrode layer 50 and the insulation layer 60 in this order.

The third metal layer 11a includes at least one of Ni, cobalt (Co), copper (Cu), and gold (Au), for example. For example, a thickness (a length along the Z-axis direction, for example) of the third metal layer 11a is from 300 nm to 700 nm (both inclusive).

The fourth metal layer 12a is formed using at least one of Sn, indium (In), and bismuth (Bi), for example. For example, a thickness of the fourth metal layer 12a (a length along the Z-axis direction, for example) is from 500 nm to 1,500 nm (both inclusive).

On the other hand, a metal layer 51b (second barrier metal), a metal layer 11b (second base-material metal), and a metal layer 12b (second insert metal) are formed on the support substrate 70 in this order. The metal layer 11b may be formed using the same material as that for forming the third metal layer 11a. The metal layer 12b may be formed using the same material as that for forming the fourth metal layer 12a. In the formation of these metal layers, a sputtering method or a vacuum vapor deposition method may be used, for example.

Thereafter, the first insert metal (fourth metal layer 12a) and the second insert metal (metal layer 12b) are brought into contact with each other, and a temperature of these metals is increased while applying a pressure to these metals. In a state where a pressure is applied to these metals and a temperature of these metals is increased, these metals are held for a predetermined time so as to bond these metals to each other. In this bonding step, the first to second insert metals and the first and second base-material metals are respectively bonded to each other thus forming the first metal layer 10.

For example, in this bonding step, when a stepped portion between the n-side electrode layer 50 formed on the contact portion 20c and the insulation layer 60 formed on the p-side electrode layer 40 is large, there may be a case where a bonding failure occurs. In the exemplary embodiment, for example, by forming the spacers on the contact portion 20c, a stepped portion may be decreased. Due to such a configuration, in this bonding step, it is possible to suppress the occurrence of a bonding failure.

Figure 2D:
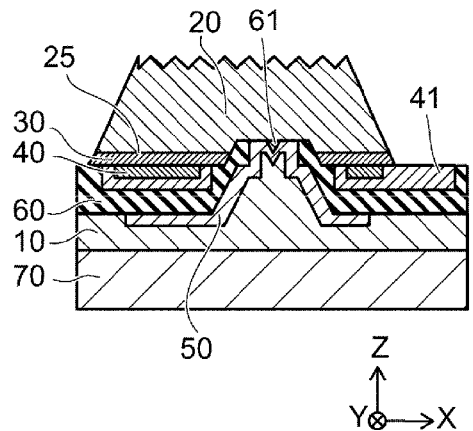

As illustrated in FIG. 2D, the growth substrate 76 is removed. For example, the growth substrate is ground and spin etching is performed. Due to such a treatment, the growth substrate 76 may be removed while leaving the laminated body such as the light emitting layer on a support substrate 70 side. Then, a portion of the laminated body is removed by etching so that the remaining laminated body is formed into a desired shape. Then, a surface of the n-type semiconductor layer 20 is formed into an uneven surface thus forming the light irradiation surface 20a.

Figure 2E:
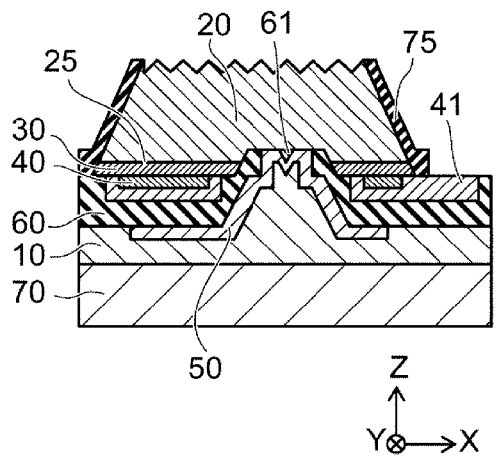

Then, as illustrated in FIG. 2E, a passivation film 75 is formed on side surfaces (surfaces oblique to or intersecting the Z-axis direction) of the semiconductor layers (the n-type semiconductor layer 20, the p-type semiconductor layer 30, and the light emitting layer 25).

Figure 2F:
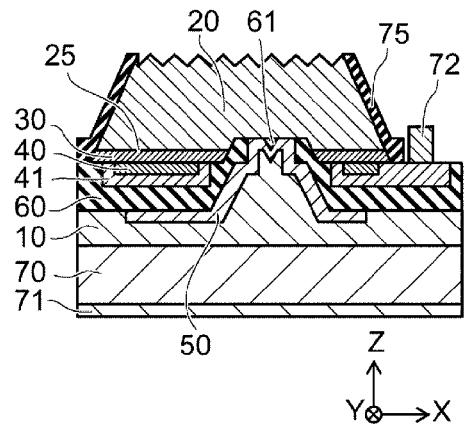

Then, as illustrated in FIG. 2F, the pad electrode 72 and the back surface electrode 71 are formed. In this manner, the semiconductor light emitting element 100 is completed. FIG. 2 illustrates the case where only one via hole 20v is formed and hence, the number of contact portions 20c is also one. However, a plurality of via holes 20v may be formed. That is, a plurality of contact portions 20c may be formed. Further, although only one spacer 61 is formed on the contact portion 20c, the plurality of spacers 61 may be formed on the contact portion 20c.

Figure 3:
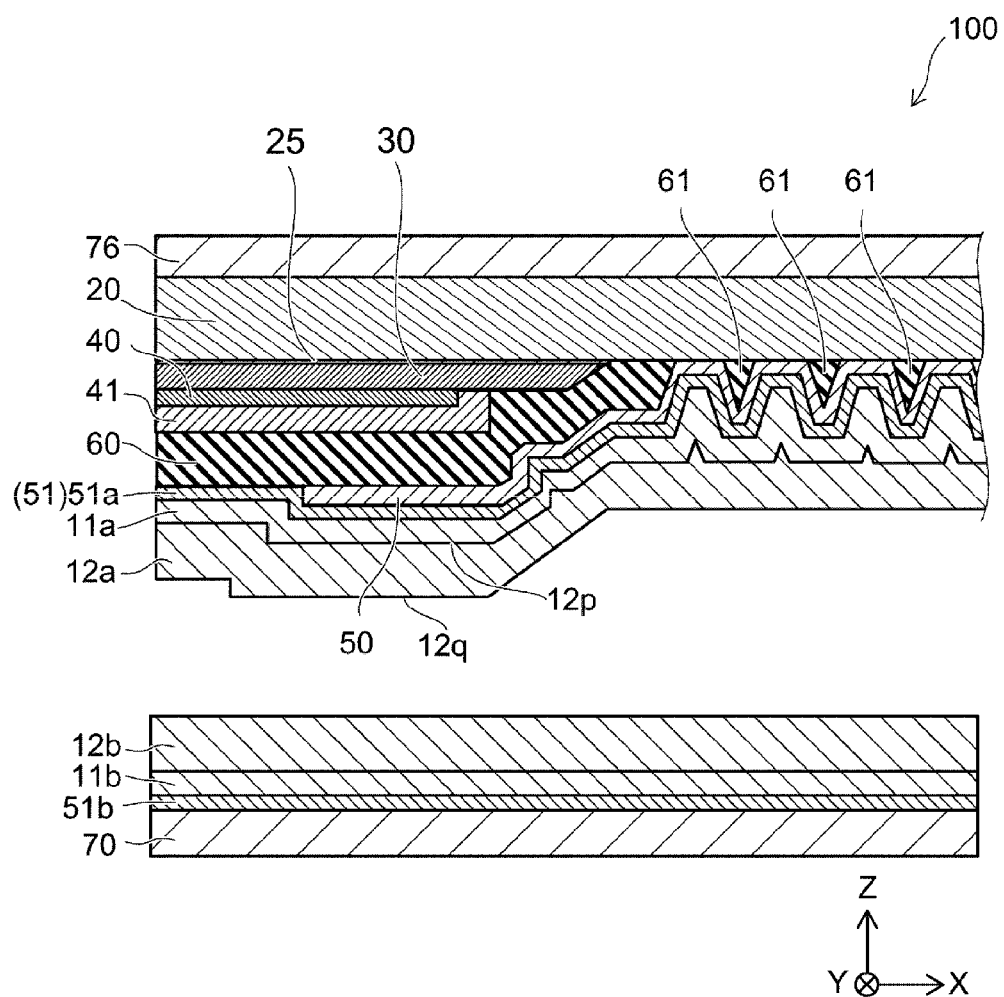
FIG. 3 is a schematic cross-sectional view illustrating a step in manufacturing the semiconductor light emitting element according to the first embodiment.

FIG. 3 is a schematic cross-sectional view exemplifying the step of manufacturing the semiconductor light emitting element according to the first embodiment. FIG. 3 also exemplifies a portion illustrated in FIG. 2C in an enlarged manner.

As illustrated in FIG. 3, the fourth metal layer 12a includes a surface 12p which faces the third metal layer 11a in an opposed manner, and a surface 12q on a side opposite to the surface 12p. The surface 12q is a bonding surface which is bonded to the second insert metal (metal layer 12b) formed on the support substrate 70. The surface 12q has a stepped portion in the Z-axis direction. When the stepped portion is large, a large gap is generated in the bonding step and hence, even when the fourth metal layer 12a and the metal layer 12b are melted at the time of bonding, it is not possible to fill the gap with molten metal and hence, there may be a case where a bonding failure occurs. When the bonding failure occurs, there may be a case where the semiconductor layer 20 of the via hole 20v does not withstand a stress generated in the GaN layer so that the semiconductor layer 20 is peeled off from the GaN layer in the step of removing the growth substrate 76, for example.

In the embodiment, the spacers 61 are formed on the n-type semiconductor layer 20. Thereafter, the n-side electrode layer 50, the second metal layer 51 and the third metal layer 11a are formed on the n-type semiconductor layer 20 which is exposed between the spacers 61 and the spacers 61. Gaps formed between the spacers 61 are filled with the n-side electrode layer 50, the second metal layer 51 and the third metal layer 11a corresponding to a thickness of the n-side electrode layer 50, a thickness of the second metal layer 51, and a thickness of the third metal layer 11a. Accordingly, a surface of the third metal layer 11a which is brought into contact with the fourth metal layer 12a is positioned away from the n-type semiconductor layer 20 substantially by an amount of a thickness of the spacer 61. Accordingly, the stepped portion of the surface 12q of the fourth metal layer 12a which is formed on the third metal layer 11a may be decreased substantially by an amount of a thickness of the spacer 61. Due to such a configuration, it is possible to suppress the occurrence of a bonding failure.

In this embodiment, the spacers 61 are formed simultaneously with the insulation layer 60. In this case, the spacer 61 is made of at least either one of silicon oxide and silicon nitride. A thickness (a length along the Z-axis direction) of the spacer 61 is 0.9 to 1.1 times (both inclusive) as large as the thickness (a length along the Z-axis direction) of the insulation layer 60. For example, a thickness of the spacer 61 is substantially equal to the thickness of the insulation layer 60.

FIG. 4A to FIG. 4E are schematic plan views illustrating examples of a shape of the spacer of the semiconductor light emitting element according to the first embodiment.

FIG. 4A to FIG. 4E are views of the spacer 61 as viewed in the Z-axis direction. That is, FIG. 4A to FIG. 4E illustrate the examples of a planar shape of the spacer 61.

Figure 4A:
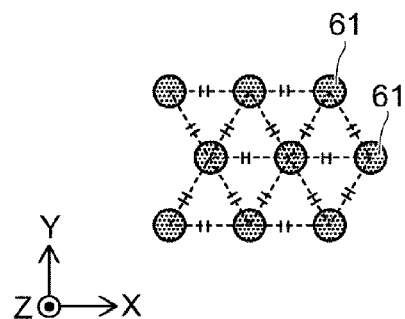
FIG. 4A to FIG. 4E are schematic plan views illustrating examples of a shape of a spacer of the semiconductor light emitting element according to the first embodiment.
Figure 4B:
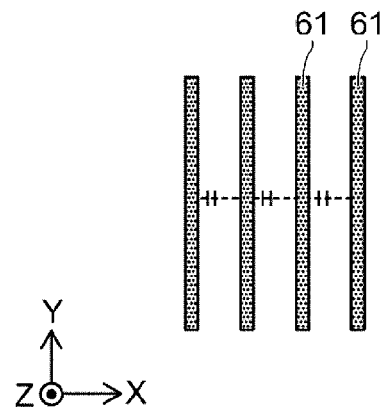
Figure 4C:
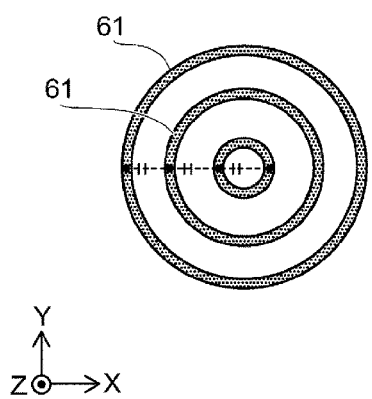

As illustrated in FIG. 4A to FIG. 4C, the plurality of spacers 61 are provided in a plane orthogonal to the Z-axis direction in this embodiment, and these spacers 61 are periodically arranged away from each other.

When a width (a length along the plane orthogonal to the Z-axis direction) between the respective spacers 61 is excessively small, it is difficult to form the spacers 61. When the width between the respective spacers 61 is excessively large, a total area of n contact (for example, an area where the n-side electrode layer 50 and the n-type semiconductor layer 20 are brought into contact with each other) is decreased so that an electric resistance of the electrode is increased. Accordingly, for example, it is preferable to set the width between the respective spacers 61 to 1 μm to 3 μm inclusive.

As described previously, the n-side electrode layer 50, the second metal layer 51a and the third metal layer 11a are embedded in the gap formed between each two spacers 61 arranged adjacent to each other among the plurality of spacers 61. A step coverage in forming the n-side electrode layer 50, the second metal layer 51a, and the third metal layer 11a is 0.7 to 1.0, for example. In view of the above, it is preferable that a distance between two spacers 61 arranged adjacent to each other among the plurality of spacers 61 is from 1.4 to 2.0 times (both inclusive) as large as a sum of a thickness of the n-side electrode layer 50, a thickness of the second metal layer 51a, and a thickness of the third metal layer 11a, for example. In view of the thickness of the third metal layer 11a, it is preferable that a distance between each two spacers 61 arranged adjacent to each other among the plurality of spacers 61 is from 1.5 to 3.5 times (both inclusive) as large as the sum of the thickness of the n-side electrode layer 50 and the thickness of the second metal layer 51a, for example.

For example, the thickness of the n-side electrode layer 50 is a length of the n-side electrode layer 50 along the direction perpendicular to a plane where the spacers 61 and the n-side electrode layer 50 are brought into contact with each other. For example, the thickness of the second metal layer 51a is a length of the second metal layer 51a along the direction perpendicular to a plane where the n-side electrode layer 50 and the second metal layer 51a are brought into contact with each other. For example, the thickness of the third metal layer 11a is a length of the third metal layer 11a along the direction perpendicular to a plane where the second metal layer 51a and the third metal layer 11a are brought into contact with each other.

For example, it is preferable that the spacers 61 are disposed substantially equidistantly from each other. For example, in the embodiment illustrated in FIG. 4A to FIG. 4C, a distance between the certain spacers 61 arranged adjacent to each other is 0.9 to 1.1 times (both inclusive) as large as a distance between other spacers 61 arranged adjacent to each other.

As illustrated in FIG. 4A, the plurality of spacers 61 may be arranged in an X-Y plane such that the spacers 61 are positioned at vertices of an equilateral triangle respectively, for example.

As illustrated in FIG. 4B, each spacer 61 may have a linear planar shape, and the plurality of spacers 61 may be arranged periodically, for example.

As illustrated in FIG. 4C, the plurality of spacers 61 may have concentric planar shapes respectively, for example. That is, around one annular spacer 61, other annular spacers 61, which are larger than one annular spacer 61, are concentrically arranged. The plurality of spacers 61 are arranged such that a distance between the spacers 61 is constant.

Figure 4D:
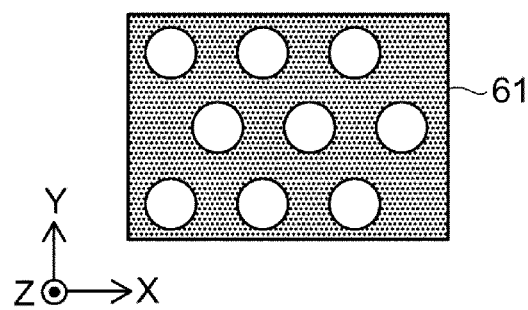
Figure 4E:
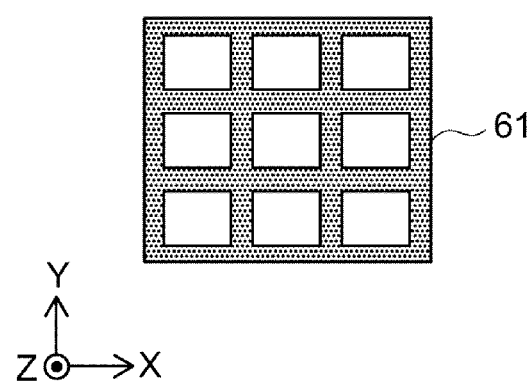

As illustrated in FIG. 4D and FIG. 4E, the spacer 61 includes a plurality of opening portions. The opening portion may be formed into any shape such as a circular shape or a rectangular shape. However, it is preferable that the opening portions formed in one spacer 61 have the same shape, and it is also preferable that the opening portions are arranged equidistantly, periodically or regularly.

The planar shape of the spacer 61 in the example illustrated in FIG. 4D is a shape obtained by reversing portions where the spacer 61 is formed and portions where the spacer 61 is not formed in the planar shape of the arrangement of the spacers 61 illustrated in FIG. 4A. That is, the plurality of opening portions formed in the spacer 61 is arranged such that the opening portions are arranged at vertices of an equilateral triangle in the X-Y plane. In the embodiment illustrated in FIG. 4E, for example, the spacer 61 is formed in a mesh shape in the X-Y plane.

As described above, the spacers 61 may be formed continuously in the plane orthogonal to the Z-axis direction.

In this manner, various modifications are considered with respect to the spacers 61. With the provision of the spacers 61, it is possible to suppress the occurrence of bonding failure.

Second Embodiment

Figure 5:
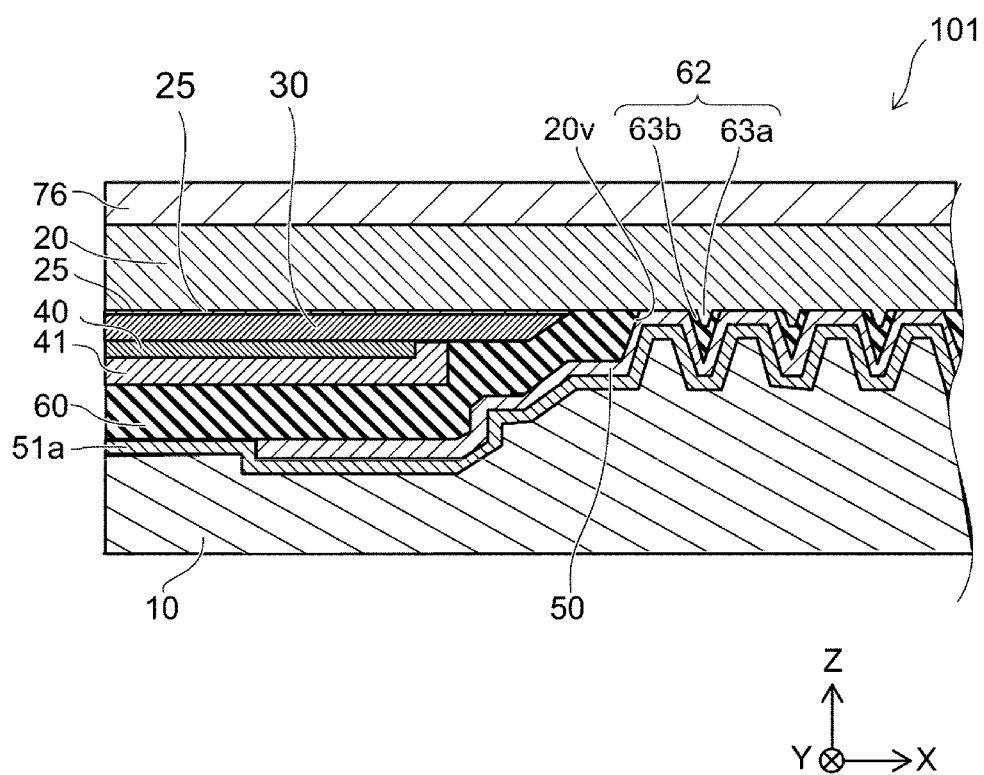
FIG. 5 is a schematic cross-sectional view illustrating a portion of a semiconductor light emitting element according to a second embodiment.

FIG. 5 is a schematic cross-sectional view exemplifying a portion of a semiconductor light emitting element according to a second embodiment.

As illustrated in FIG. 5, in a semiconductor light emitting element 101, each of a plurality of spacers 62 has the laminar structure where two layers made of different materials are laminated to each other. That is, the spacer 62 includes a first layer 63a and a second layer 63b. The second layer 63b is formed between the first layer 63a and an n-side electrode layer 50.

For example, the first layers 63a may be formed in the step of etching the p-type semiconductor layer 30 illustrated in FIG. 2B. The first layers 63a are formed by etching the p-type semiconductor layer 30 corresponding to a layout of the spacers 62. For example, portions of the p-type semiconductor layer 30 become the first layers 63a respectively. The first layer 63a may be made of a material which is used for forming the p-type semiconductor layer 30. For example, the first layer 63a may be made of p-type GaN. The first layer 63a may include a portion of the light emitting layer 25 or a portion of the n-type semiconductor layer 20.

For example, the second layers 63b may be formed simultaneously with the insulation layer 60. For example, as explained in the first embodiment, the insulation film 60a is formed, and the insulation layer 60 is formed by patterning the insulation film 60a. In performing such patterning, the insulation film 60a is patterned in conformity with the positions where the first layers 63a are formed. Due to such treatment, the second layers 63b are formed on the first layers 63a. For example, the second layer 63b may be made of the same material as that for forming the insulation layer 60. For example, the second layer 63b may be made of at least either one of silicon oxide and silicon nitride.

In this manner, with the provision of the spacers 62, a stepped portion in the fourth metal layer 12a may be further decreased. Due to such a configuration, it is possible to further suppress the occurrence of a bonding failure thus providing a highly reliable semiconductor light emitting element.

In this disclosure, "perpendicular" means not only "perpendicular" in a strict meaning of the term but also "perpendicular having an irregularity caused in a manufacturing step or the like", for example. That is, it is sufficient that "perpendicular" is "substantially perpendicular".

The embodiments have been explained by reference to the specific examples heretofore. However, the embodiments are not limited to these specific examples. For example, with respect to the specific configurations of the respective elements such as the first metal layer, the n-type semiconductor layer, the p-type semiconductor layer, the light emitting layer, the p-side electrode layer, and the insulation layer, these configurations fall within the scope of the present disclosure provided that those who are skilled in the art may carry out the present disclosure in the same manner as these embodiments by suitably selecting the configurations from a known range and may acquire the substantially equal advantageous effects as these embodiments.

Further, the combination of two or more elements in each specific example within a technically possible range also falls within the scope of the present disclosure provided that the combination contains the gist of the present disclosure.

Further, all semiconductor light emitting elements which those who are skilled in the art may carry out by suitably changing designs based on the semiconductor light emitting elements described above as the embodiments also fall within the scope of the present disclosure so long as these semiconductor light emitting elements contain the gist of the present disclosure.

Still further, various variations and modifications are conceivable to those who are skilled in the art within a category of the technical concept of the present disclosure, and it is construed that these variations and modifications also fall within the scope of the present disclosure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light emitting element, comprising:
    a first semiconductor layer of a first conductive type and having a first side and a second side opposite the first side;
    a second semiconductor layer of a second conductive type on the first side of the first semiconductor layer;
    a light emitting layer between the first semiconductor layer and the second semiconductor layer;
    a first electrode layer contacting the second semiconductor layer, the second semiconductor layer being between first electrode layer and the light emitting layer;
    a second electrode layer contacting the first semiconductor layer on the first side along a first part of a surface of the first semiconductor layer;
    an insulation layer between the first electrode layer and the second electrode layer, contacting a second part of the surface of the first semiconductor layer, and being between the second semiconductor layer and the second electrode layer, the second part of the surface surrounding the first part of the surface; and
    a first metal layer between a substrate and the insulation layer and between the substrate and the second electrode layer, wherein
    the second electrode layer includes a first portion contacting the first part of the surface of the first semiconductor layer, and a second portion adjacent to first portion in a direction parallel to the surface,
    the second portion being spaced from the surface of the first semiconductor layer in a direction perpendicular to the surface, and
    a thickness of the first metal layer between the substrate and the first portion of the second electrode layer is greater than a thickness of the first metal layer between the substrate and the second portion of the second electrode layer and the substrate.

2. The light emitting element according to claim 1, wherein the first metal layer includes at least one of tin, indium and bismuth.

3. The light emitting element according to claim 1, wherein the second electrode layer contacts the first semiconductor layer in a plurality of regions spaced from each other in the direction parallel to the surface of the first semiconductor layer.

4. The light emitting element according to claim 1, further comprising:
    a spacer between the first semiconductor layer and the second portion of the second electrode layer.

5. The light emitting element according to claim 4, wherein the spacer comprises at least one of silicon oxide or silicon nitride.

6. The light emitting element according to claim 4, wherein a thickness of the spacer is between 0.9 to 1.1 times as large as a thickness of the insulation layer in the direction perpendicular to the surface of the first semiconductor layer.

7. The light emitting element according to claim 4, wherein the spacer includes:
    a first layer including a material included in the first semiconductor layer; and
    a second layer between the first layer and the second electrode layer and includes a material included in the insulation layer.

8. The light emitting element according to claim 4, wherein a plurality of spacers is periodically disposed.

9. The light emitting element according to claim 8, wherein the each spacer in the plurality of spacers has an annular shape.

10. The light emitting element according to claim 8, wherein the each spacer in the plurality of spacers is respectively disposed at a vertex of an equilateral triangle.

11. The light emitting element according to claim 8, further comprising:
    a second metal layer between the insulation layer and the first metal layer and between the second electrode layer and the first metal layer.

12. The light emitting element according to claim 11, wherein a distance between each two spacers arranged adjacent to each other among the plurality of spacers is 1.5 to 3.5 times as large as a combined total of a thickness of the second electrode layer and a thickness of the second metal layer, each in the direction perpendicular to the surface of the first semiconductor layer and measured at the first part of the surface.

13. The light emitting element according to claim 4, wherein the spacer has a plurality of openings.

14. The light emitting element according to claim 1, wherein
    the first metal layer includes at least one of an alloy of a first metal and a second metal, and an intermetallic compound of the first metal and the second metal,
    the first metal includes at least one of tin, indium, and bismuth, and
    the second metal includes at least one of nickel, cobalt, copper, and gold.

15. The light emitting element according to claim 1, wherein the first electrode layer is covered with a protective electrode layer.

16. A light emitting device, comprising:
    a first semiconductor layer of a first conductive type and having a first side and a second side opposite the first side;
    a second semiconductor layer of a second conductive type on the first side of the first semiconductor layer;
    a light emitting layer between a first region of the first semiconductor layer and the second semiconductor layer in a first direction;
    a first electrode layer on the second semiconductor layer, the second semiconductor layer being between the first electrode layer and the light emitting layer in the first direction;
    a second electrode layer on the first side of the first semiconductor layer and having a first portion contacting a second region of the first semiconductor layer, the second region being adjacent to the first region in a second direction perpendicular to the first direction;
    a spacer material between the second region of the first semiconductor layer and a second portion of the second electrode layer; and
    an insulation layer between the first electrode layer and the second electrode layer and between the second semiconductor layer and the second electrode layer.

17. The light emitting device according to claim 16, wherein the spacer material is an insulating material.

18. The light emitting device according to claim 16, wherein the spacer material is in a grid pattern on the second region of the first semiconductor layer.

19. A light emitting device, comprising:
- a first semiconductor layer of a first conductive type and having a first side and a second side opposite the first side;
- a second semiconductor layer of a second conductive type on the first side of the first semiconductor layer;
- a light emitting layer between a first region of the first semiconductor layer and the second semiconductor layer in a first direction;
- a first electrode layer on the second semiconductor layer, the second semiconductor layer being between the first electrode layer and the light emitting layer in the first direction;
- a second electrode layer on the first side of the first semiconductor layer and having a first portion contacting a second region of the first semiconductor layer, the second region being adjacent to the first region in a second direction perpendicular to the first direction;
- a spacer material between the second region of the first semiconductor layer and a second portion of the second electrode layer;
- an insulation layer between the first electrode layer and the second electrode layer and between the second semiconductor layer and the second electrode layer; and
- a first metal layer between a substrate and the insulation layer and between the substrate and the second electrode layer, wherein
- a thickness, in the first direction, of the first metal layer between the substrate in and the first portion of the second electrode layer is greater than a thickness, in the first direction, of the first metal layer between the substrate and the second portion of the second electrode layer.

20. The light emitting device according to claim 19, wherein the first metal layer includes at least one of tin, indium and bismuth.

* * * * *